United States Patent
Hasegawa

(10) Patent No.: US 9,460,891 B2
(45) Date of Patent: Oct. 4, 2016

(54) INSPECTION EQUIPMENT

(71) Applicant: Hitachi High-Technologies Corporation, Minato-ku, Tokyo (JP)

(72) Inventor: Masaki Hasegawa, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/993,470

(22) Filed: Jan. 12, 2016

(65) Prior Publication Data

US 2016/0203946 A1 Jul. 14, 2016

(30) Foreign Application Priority Data

Jan. 13, 2015 (JP) ................................ 2015-004025

(51) Int. Cl.
*G01N 23/00* (2006.01)
*H01J 37/29* (2006.01)
*H01J 37/073* (2006.01)
*H01J 37/22* (2006.01)

(52) U.S. Cl.
CPC .............. *H01J 37/29* (2013.01); *H01J 37/073* (2013.01); *H01J 37/222* (2013.01); *H01J 2237/0473* (2013.01); *H01J 2237/24592* (2013.01); *H01J 2237/2602* (2013.01)

(58) Field of Classification Search
None
See application file for complete search history.

(56) References Cited

U.S. PATENT DOCUMENTS

| | | | | |
|---|---|---|---|---|
| 4,538,069 A * | 8/1985 | Shambroom | .......... | B82Y 10/00 250/491.1 |
| 4,686,531 A * | 8/1987 | Shambroom | .......... | G01B 7/082 324/611 |
| 6,310,341 B1 * | 10/2001 | Todokoro | ................ | H01J 37/05 250/305 |
| 6,465,781 B1 * | 10/2002 | Nishimura | ............ | H01J 37/026 250/305 |
| 6,825,480 B1 * | 11/2004 | Watanabe | ............ | G01R 31/307 250/310 |
| 6,828,571 B1 * | 12/2004 | McCord | ............ | G01R 31/2653 250/307 |
| 2002/0117635 A1 | 8/2002 | Shinada et al. | | |
| 2002/0117636 A1 * | 8/2002 | Sasaki | ..................... | G11B 7/261 250/492.3 |
| 2003/0006371 A1 * | 1/2003 | Watanabe | ............. | H01J 37/153 250/310 |
| 2006/0060781 A1 * | 3/2006 | Watanabe | ............... | B82Y 10/00 250/310 |
| 2008/0073533 A1 * | 3/2008 | Makino | ............... | G03F 7/70616 250/310 |
| 2008/0315093 A1 * | 12/2008 | Hasegawa | ............ | G01N 23/225 250/310 |
| 2009/0242759 A1 * | 10/2009 | Bray | ..................... | G01R 31/307 250/307 |
| 2011/0115637 A1 * | 5/2011 | Kikuchi | .................. | H01J 37/20 340/600 |
| 2011/0284759 A1 * | 11/2011 | Kono | ....................... | H01J 37/28 250/396 ML |
| 2011/0298915 A1 * | 12/2011 | Hiroi | ....................... | G06T 7/001 348/80 |

FOREIGN PATENT DOCUMENTS

JP 11-108864 A 4/1999
JP 11108864 A * 4/1999

* cited by examiner

*Primary Examiner* — Andrew Smyth
(74) *Attorney, Agent, or Firm* — Crowell & Moring LLP

(57) ABSTRACT

Inspection equipment frequency transforms a mirror electron image with respect to position coordinates, calculates a value of a frequency plane origin or a value at a vicinity of the frequency plane origin as a first measurement value, and calculates a second measurement value by totalizing values of image intensities in a certain area, the image intensities having been obtained through normalization by the origin value or origin-vicinity value and the frequency transform. The inspection equipment automatically controls the voltage of a wafer holder based on the first and second measurement values.

15 Claims, 9 Drawing Sheets

INSPECTION EQUIPMENT

CLAIM OF PRIORITY

The present application claims priority from Japanese patent application JP2015-4025 filed on Jan. 13, 2015, the content of which is hereby incorporated by reference into this application.

BACKGROUND

This disclosure relates to inspection equipment and is applicable to, for example, defect inspection equipment using a mirror electron microscope.

When semiconductor devices are manufactured, fine circuits are formed over mirror-polished surfaces of wafers made of, for example, silicon (Si) or silicon carbide (SiC). When there are foreign objects, flaws, or crystal defects over wafer surfaces, they may cause various problems. For example, during a circuit pattern formation process, circuit pattern defects or material degradation may occur consequently to make manufactured devices inoperative, to make desired electrical characteristics unavailable, or to cause degradation of the operational reliability of manufactured devices. Such problems prevent devices from being finished as products.

For wafer inspection to be performed prior to a circuit pattern forming process, they have been using a technique (optical scattering inspection technique) in which light of a wavelength in a range from visible to ultraviolet (hereinafter referred to simply as "light") is emitted to irradiate a wafer surface and in which light scattered at the wafer surface is detected and inspection equipment making use of an optical microscope technique, for example, a differential interference microscope. With the progress of semiconductor device miniaturization, however, it has become necessary to control foreign objects which, being so fine, cannot, generate, when irradiated with light, detectable scattered light intensities. Also, crystal defects which cannot be imaged using an optical microscope technique affect the reliability of semiconductor devices. Thus, existing inspection techniques using light can cause hindrance to wafer quality control.

An electron microscope technique using an electron beam can be used to detect foreign objects and defects which cannot be detected using light. An electron microscope has an extremely high spatial resolution and can easily image foreign objects sized smaller than 20 nanometers with remarkably low light scattering intensities. An electron beam is formed of charged particles, so that it can detect crystal defects which cannot be detected using light by making use of electrical properties of crystal defects. However, while an electron microscope can capture an image in a practical amount of time when observing a small micron-sized view field, it takes a great amount of time to observe the whole surface of a wafer to be a semiconductor substrate. For example, to inspect the whole surface of a silicon wafer measuring 100 mm in diameter with a resolution of about 10 nm, a scanning electron microscope requires about six days according to estimation based on typical conditions.

A new faster inspection method in which an electron beam is used is disclosed in Japanese Unexamined Patent Application Publication No. Hei 11 (1999)-108864. In the technique, a negative potential close to the acceleration. voltage applied to an irradiating electron beam is applied to the surface of a wafer to be inspected, thereby, causing an electron beam emitted toward a whole inspection view field over the wafer surface to turn back near the wafer surface. The turned-back electrons pass through an electron lens to form an image. Such turned-back electrons will hereinafter be referred to as "mirror electrons." The technique disclosed in Japanese Unexamined Patent Application Publication No. Hei 11 (1999)-108864 is an inspection technique which uses a mirror electron microscope for making mirror electrons from an image.

SUMMARY

To maintain defect detection sensitivity during defect inspection performed using a mirror electron microscope, it is necessary to keep reflection of an electron beam from near the surface of a wafer under inspection. However, the wafer surface potential varies, for example, depending on the wafer material, materials in the vicinity of the wafer surface, or the variation of the negative voltage applied from a power supply to the wafer. The acceleration voltage applied to the electron beam can also vary, so that the energy of the electron beam varies timewise and spatially. It is, therefore, necessary to automatically control the electron beam reflection height during inspection operation.

Other objects and novel features of the present invention will become apparent from the following description of this disclosure and the accompanying drawings.

Typical inspection equipment described in the present disclosure is briefly described below.

Inspection equipment includes: an irradiation optical system to irradiate an area including a field of view on a wafer with an electron beam emitted from an electron source; a voltage application unit to apply a controlled negative voltage to the wafer or a wafer holder holding the wafer; a mirror-electron imaging optical system to capture a mirror electron image by, with the voltage applied to the wafer or the wafer holder, having an image formed by electrons reflected from the wafer; a calculation unit which frequency-transforms the mirror is electron image with respect to position coordinates and calculates a value of a frequency plane origin or a value at a vicinity of the frequency plane origin as a first measurement value and that also calculates a second measurement value by totalizing values of image intensities in a certain area, the image intensities having been obtained through normalization by the origin value or origin-vicinity value and the frequency transform; a control unit which, based on the first measurement value and the second measurement value, outputs to the voltage application unit a signal to control the voltage applied by the voltage application unit; and a defect detection unit which detects a defect of the wafer using the mirror electron image obtained at DC voltage controlled by the control unit.

According to the above inspection equipment, during wafer inspection performed using a mirror electron microscope, the height at which an electron beam is reflected above the wafer surface can be automatically controlled.

DESCRIPTION OF THE PREFERRED EMBODIMENTS

In the following, an embodiment form and embodiments of the present invention will be described with reference to drawings. In the following description, identical elements will be denoted by identical symbols and repetitive descriptions of such identical elements may be omitted.

Figure 1A:
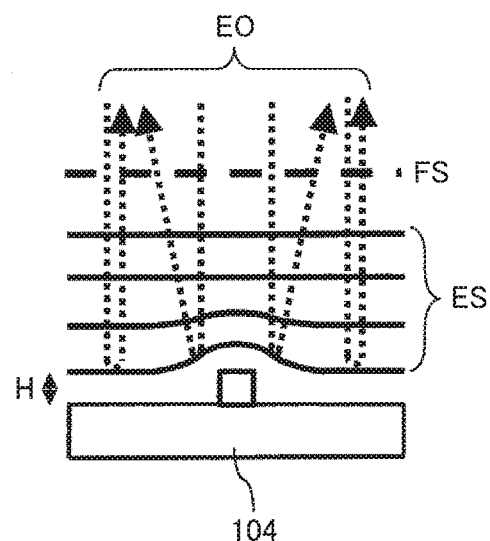
FIGS. 1A and 1B each illustrate contrast generation for a mirror electron microscope image.
Figure 1B:
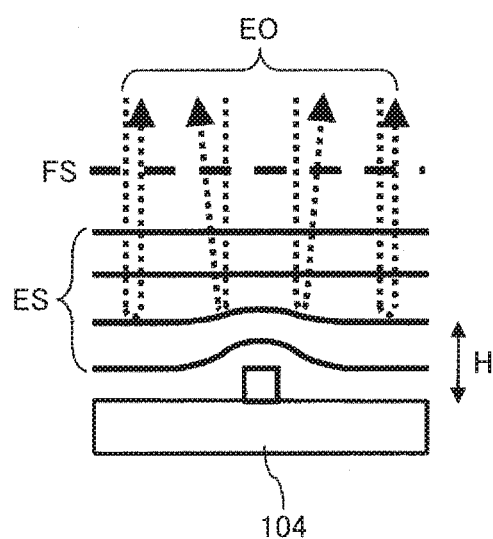

The defect detection sensitivity of a mirror electron microscope is heavily dependent on the height at which the electrons are reflected above a wafer-under-inspection surface. This will be described with reference to FIGS. 1A and 1B. FIGS. 1A and 1B each show a sectional view near the surface of a wafer under inspection. The wafer has a projection on its surface, and equipotential surfaces and electron orbits above the wafer surface are also schematically drawn in each of FIGS. 1A and 1B. The equipotential surface reflecting electrons is closer to the wafer surface in FIG. 1A than in FIG. 1B.

In a mirror electron microscope, an electron beam (electron orbit: EO) is vertically and parallelly emitted toward a wafer surface and is reflected from an equipotential surface ES having a surface potential determined by the voltage supplied to the wafer holder holding a wafer 104. The distance between the wafer surface and the equipotential surface reflecting the electron beam is referred to as a "reflection height" (H). As shown in FIG. 1A, when the equipotential surface ES to reflect an electron beam. is close to the wafer surface having a projection, it has a sharply inclined portion which causes the electron beam (electron orbit EO) to be largely deflected when reflected. When, as shown in FIG. 1B, the electron beam is reflected at an equipotential surface ES which is snore away from the wafer surface and the partial inclination of which is less sharp, the electron beam (electron orbit EO) is reflected at the equipotential surface ES without being deflected so much as shown in FIG. 1A. A focus surface FS shown in each of FIGS. 1A and 1B is where the objective lens of the mirror electron microscope is focused. The electron density variation at the focus surface FS is larger in the case shown in FIG. 1A in which the electron beam is shown largely deflected when reflected than in the case shown in FIG. 1B. Namely, in the case shown in FIG. 1A, a mirror electron image formed representing a projection, for example, a foreign object over the wafer surface shows a great contrast meaning that the sensitivity to detect such a projection is high. In the case shown in FIG. 1B where the electron beam is reflected at an equipotential surface ES which is more away from the wafer surface than in the case shown in FIG. 1A, the contrast of the mirror electron image is smaller meaning that the projection detection sensitivity is lower. Therefore, for defect detection to be performed using a mirror electron microscope, it is necessary to control the wafer surface potential and the energy of the electron beam to be emitted so as to cause the electron beam to be reflected at as close an equipotential surface as possible to the wafer surface.

Since directly measuring the electron beam reflection height (H) is extremely difficult, the electron beam reflection height (H) is determined based on, for example, the mirror electron image resolution and brightness.

Embodiment Form

Inspection equipment according to an embodiment form frequency-transforms a mirror electron image with respect to position coordinates, calculates a value of a frequency plane origin or a value at a vicinity of the frequency plane origin as a first measurement value, and calculates a second measurement value by totalizing values of image intensities in a certain area, the image intensities having been obtained through normalization by the origin value or origin-vicinity value and the frequency transform. The inspection equipment automatically controls the voltage of a wafer holder based on the first and second measurement values.

For an electron beam emitted during inspection operation to be reflected by a negative potential of a wafer surface, the voltage applied to the wafer can be automatically controlled so as to cause the electron beam to be reflected at an appropriate height above the wafer surface. This makes it possible to determine and maintain defect detection sensitivity required during inspection for defect detection. Hence, wafer defects can be detected before the wafer is processed, so that the possibility of manufacturing defective devices can be reduced.

First Embodiment

Figure 2:
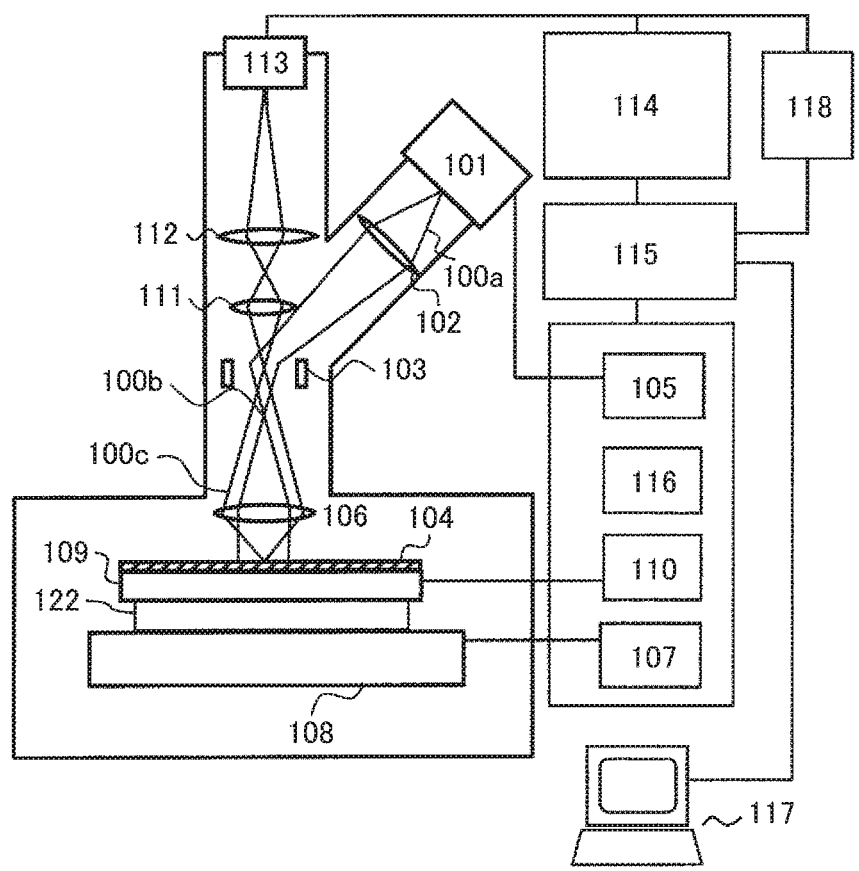
FIG. 2 is a diagram for explaining inspection equipment according to a first embodiment.
Figure 3:
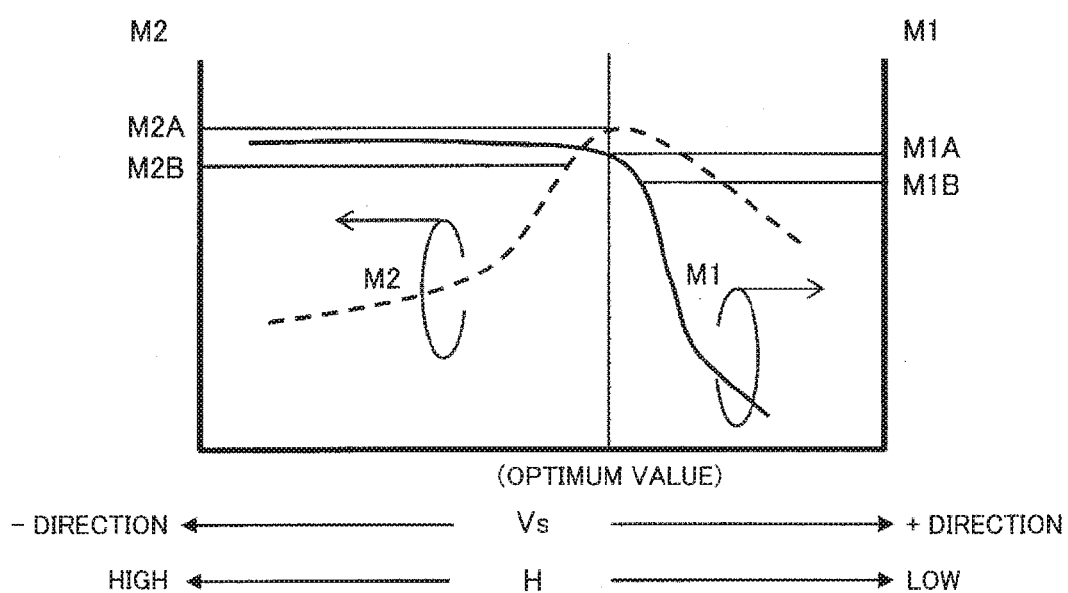
FIG. 3 is a diagram for explaining the inspection equipment according to the first embodiment.
Figure 4:
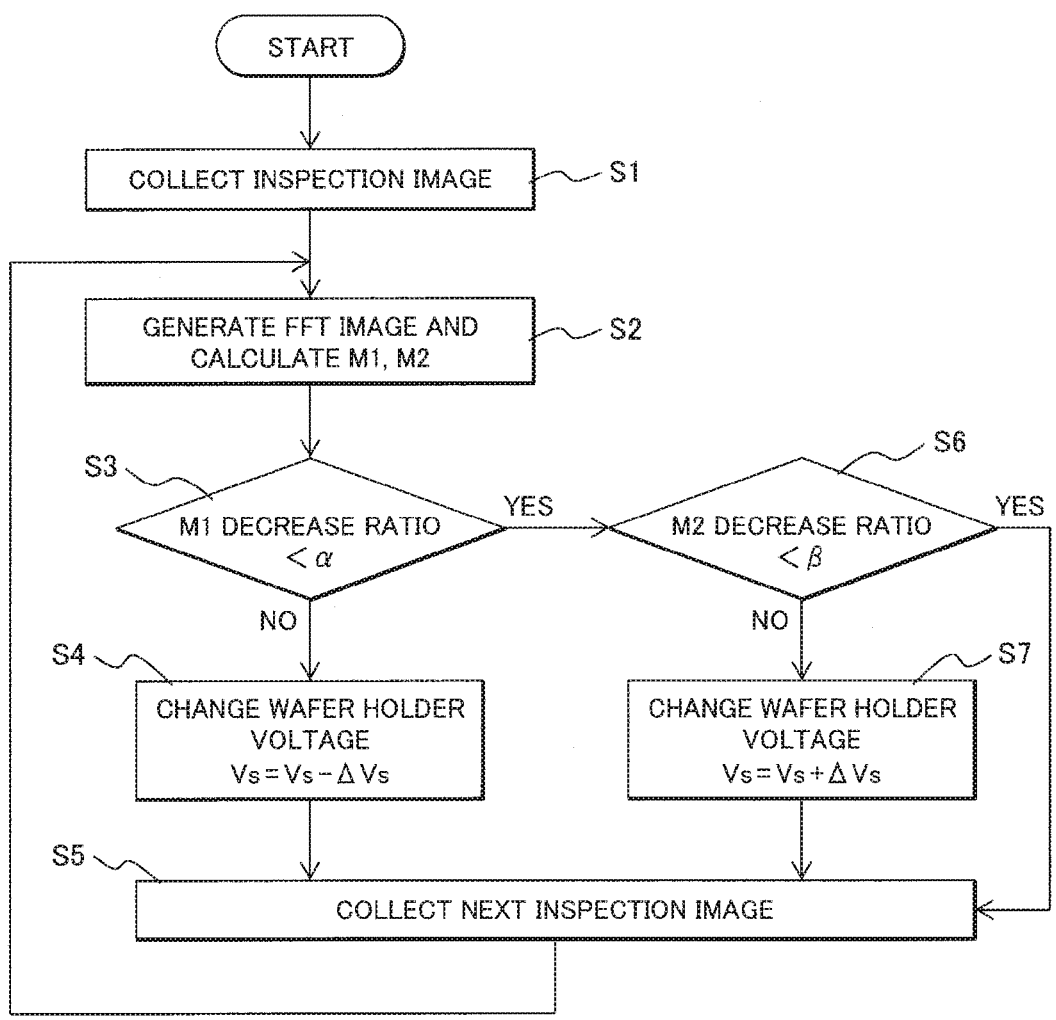
FIG. 4 is a diagram for explaining the inspection equipment according to the first embodiment.

Inspection equipment of a first embodiment according to the embodiment form will be described with reference to FIGS. 2 to 4. FIG. 2 shows a configuration of the inspection equipment of the first embodiment. FIG. 3 shows how a first measurement value and a second measurement value vary. FIG. 4 is a flowchart for automatically controlling a reflection height during inspection. Note that, in FIG. 2, such relevant devices as a vacuum pump and control devices therefor, exhaust system piping, and a transportation system for transporting wafers to be inspected are omitted. Also, in FIG. 2, the electron orbit representation is exaggerated for the sake of description.

Electron Irradiation

First, parts related with electron irradiation in inspection equipment 10 of the first embodiment will be described. An irradiating electron beam 100a emitted from an electron gun 101 passes through a condenser lens 102 to be converged by the lens, then, by being deflected by a separator 103, becomes an approximately parallel flux and irradiates the wafer 104 (an area including a view field on the wafer).

The electron gun 101 uses a Zr/O/W type Schottky electron source which has a small light source diameter and can obtain a large current value. An alternative electron source, for example, an $LaB_6$ electron source capable of obtaining a higher current value or a cold-cathode electron source with higher brightness may also be used. The electron gun 101 may be a magnetic field superposition type electron gun including an electromagnetic lens disposed near an electron source. The voltages and current such as the extraction voltage of the electron gun 101, the acceleration voltage for the extracted electron beam and the electron source filament heating current required to operate the electron gun are supplied from and controlled by an electron gun control device 105.

Though, in FIG. 2, the condenser lens 102 is represented as a single lens, it may be a system combining plural lenses and poles so as to obtain an irradiating electron bean with higher parallelism. The condenser lens 102 is adjusted such that the electron beam converges on the back focal plane of an objective lens 106. The objective lens 106 is an electrostatic lens including plural electrodes or an electromagnetic lens.

The separator 103 separates the electron beam emitted to irradiate the wafer 104 under inspection and the mirror electron beam returning from the wafer 104 under inspection. The separator 103 of the present embodiment uses an E×B deflector. The E×B deflector can be set to deflect an electron beam coming from above and to let an electron beam coming from below travel straight. In this case, as shown in FIG. 2, the electron optical lens barrel to supply an irradiating electron beam is inclined and the electron optical lens barrel to make the reflected electrons reflected at the wafer 104 under inspection form an image stands upright. A deflector making use of a magnetic field only may be used as a separator. A magnetic field is provided perpendicularly to the optical axis of the electron beam, the irradiating electron beam is deflected toward the wafer 104 under inspection, and the electrons from the wafer 104 under inspection are deflected directly oppositely to the direction in which the irradiating electron beam is emitted. In this case, the optical axes of the electron beam lens barrel for irradiation and the electron beam lens barrel for image formation are symmetric with respect to the optical axis of the objective lens.

In cases where it is necessary to correct the aberration generated when the irradiating electron beam 100a is deflected by the separator 103, an aberration corrector may be additionally installed. When the separator 103 is a magnetic field deflector, an auxiliary coil is used for aberration correction.

After being deflected by the separator 103, the irradiating electron beam 100a is formed, by the objective lens 106, into a parallel flux to be vertically incident on the surface of the wafer 104 under inspection. Since, as described in the foregoing, the condenser lens 102 for irradiation is adjusted so as to let the irradiating electron beam converge at a posterior focal point 100b of the objective lens 106, an electron beam with high parallelism can irradiate the water 104 under inspection, The area irradiated with the irradiating electron beam 100a of the wafer 104 under inspection has, for example, an area of 10000 µm$^2$.

The wafer 104 under inspection is held, on a wafer holder 109 placed via an insulating member 122 on a movable stage 108 which is controlled by a movable stage control device 107. The movable stage 108 is moved in a drive system capable of controlling movement of the movable stage 108 either in a combination of rotary movement, about a rotary axis of the wafer 104 and linear movement in a radial direction of the wafer 104 or in a combination of linear movements in two mutually perpendicular directions. There are also cases where the movable stage 108 can also be linearly moved in a vertical direction and/or in an inclined direction. The movable stage 108 that can be moved as described above places a whole or part of the surface of the wafer 104 under inspection in a location irradiated with the electron beam, i.e. aligns a whole or part of the surface of the wafer 104 under inspection with the optical axis of the objective lens 106. This irradiation optical system includes the condenser lens 102 for irradiation, separator 103 and objective lens 106.

Detection of Mirror Electron Image

Next, the inspection equipment 10 will be described with respect to detection of a mirror electron image.

To generate a negative potential on the surface of the wafer 104 under inspection, a negative potential approximately equaling the electron beam acceleration voltage is supplied from a high-voltage power supply 110 to the wafer holder 109. The output of the high-voltage power supply 110 is finely adjusted beforehand such that the negative potential decelerates the irradiating electron beam 100a before reaching the wafer 104 under inspection, thereby, causing the irradiating electron beam 100a to reverse its electron orbit before hitting the wafer 104 under inspection. The electrons thus reflected at the wafer 104 under inspection become mirror electrons 100c.

The mirror electrons 100c passing the objective lens 106 form a first image. The separator 103 being an E×B deflector is controlled not to deflect an electron beam coming from below. Thus, the mirror electrons 100c travel without being deflected, and an intermediate electron lens 111 and a projection electron lens 112 sequentially form a first image. The intermediate lens 111 and projection lens 112 are each an electrostatic lens or electromagnetic lens. A final electron image is enlargedly projected on an image detection unit 113. Even though, in FIG. 2, the projection electron lens 112 is represented as a single electron lens, there are cases where a projection electron lens includes plural electron lenses and multiple poles to realize high-magnification enlargement and to facilitate image deformation correction. Though not shown in FIG. 2, the inspection equipment also includes such devices as a deflector and an astigmatism corrector as required for finer electron beam adjustment. The objective lens 106, separator 103, intermediate electron lens 111, projection electron lens 112, and other parts configure a mirror electron imaging optical system.

The image detection unit 113 converts the image formed by the mirror electrons 100c to electrical signals and sends the electrical signals to a defect determination unit 114. The image detection unit 113 includes, in some cases, a fluorescent plate to convert an electron beam into visible light and a camera to capture an electron image formed on the fluorescent plate or, in other cases, includes a two-dimensional detector such as a charge-coupled device (CCD) to detect electrons. A feature for electron image or fluorescence enhancement may also be included.

The mirror electron images of different fields on the surface of the wafer 104 under inspection are outputted from the image detection unit 113 while the movable stage 108 is driven. There are cases where the movable stage 108 is stopped for imaging each time and other cases where the movable stage 108 is kept moving at a constant speed. In the latter cases, the image detection unit 113 includes a COD and performs imaging by time delay integration (TDI). In the latter cases, the movable stage 108 need not be stopped, so that inspection can be performed at high speed, but it is necessary to synchronize the moving speed of the movable stage 108 and the image signal transfer speed (line rate) of the CCD.

The conditions for operating various parts including conditions for TDI imaging are inputted/outputted to/from an inspection equipment control unit 115. The inspection equipment control unit 115 has various conditions inputted thereto beforehand, including an acceleration voltage for electron beam generation, electron beam deflection width/speed, stage moving speed, and timing collecting image signals from image detection elements. The inspection equipment control unit 115 having such conditions inputted beforehand controls, on an overall basis, such control devices as the movable stage control device 107 and an electron optical system control device 116 which controls such electron optical elements as the condenser lens 102 and objective lens 106. There are cases where the inspection equipment control unit 115 includes plural computers which are coupled via communication lines and play different roles. An input/output device 117 with a monitor is also installed for use by the user in adjusting the inspection equipment, inputting operating conditions and carrying out inspection.

Defect Inspection

When an instruction for executing inspection is inputted from the input/output device 117 with a monitor, the movable stage 108 is driven to move an inspection starting position specified on the wafer 104 under inspection to directly below the center of the objective lens 106. After a mirror electron image is obtained by the image detection unit 113, the movable stage 108 is moved by a predetermined distance to capture a next mirror electron image. This process is repeated until the imaging position at the inspection ending position is reached. There are cases where the above process is repeated until an approximately entire surface of the wafer 104 under inspection has been imaged. In other cases, after a fixed size of surface area of the wafer 104 under inspection is inspected, the movable stage 108 is moved to start inspecting another fixed size of surface area of the wafer 104 under inspection. In cases where an approximately entire surface of the wafer 104 is to be inspected, collecting mirror electron images by TDI imaging as described in the foregoing is preferred.

The defect determination unit 114 determines, based on image data received from the image detection unit 113, whether the wafer 104 under inspection has a foreign object attached thereto or has any defect. When a foreign object or any defect is detected, the defect determination unit 114 collects the image data and also stage position data from the movable stage control device 107, and calculates the coordinate values representing where on the wafer 104 under inspection the foreign object or defect exists. Furthermore, based on an intensity profile of the detected foreign object or defect, the detected foreign object or defect is evaluated as to, for example, magnitude and type. This evaluation is made preferably during inspection operation, but it may also be made after the inspection operation based on a stored inspection Automatic Control of Reflection Height The inspection equipment 10 includes a reflection surface determination unit 118 to monitor the reflection height representing the height of the equipotential surface where the irradiating electron beam 100a is reflected above the wafer 104 under inspection. The reflection surface determination unit 118 first generates a spatial frequency distribution image by performing processing such as a frequency transform (e.g., a fast Fourier transform) with respect to position coordinates of a mirror electron image received from the image detection unit 113.

First, the value at the origin of the spatial frequency distribution, i.e. an integrated value of the image before being processed is calculated as a first measurement value (M1) for use as an index for automatic reflection surface control. This value may be substituted for by a coordinate value in the vicinity of the origin. Next, after normalizing the spatial frequency distribution image by the first measurement value calculated as described above, an integrated value of a certain area in the spatial frequency distribution image is calculated as a second measurement value (M2). As described above, the first measurement value is used for normalization of the spatial frequency distribution image. This is to say, with the spatial frequency distribution intensity being proportional to the brightness of the original image, eliminate the effects of variation of the original image brightness. For a frequency transform on the mirror electron image, the reflection surface determination unit 118 performs calculations in which the values of image intensities normalized by the origin value or an origin-vicinity value are totalized. For the calculations, frequency ranges not including frequencies attributable to defects detected in the specimen are also taken into account.

The behavior of the first and second measurement values that are based on mirror electron image characteristics and that are used for automatic reflection surface control will be described with reference to FIG. 3. In FIG. 3, variation of the first measurement value relative to the reflection height is represented by a solid-line curve, and variation of the second measurement value is represented by a broken-line curve. In FIG. 3, the horizontal axis represents reflection height (H). The reflection height is dependent on the magnitude of the negative voltage of the wafer holder 109, so that the reflection height (H) represented by the horizontal axis may be replaced by the voltage (Vs) of the wafer holder 109. Namely, the height of mirror reflection increases as the negative voltage value of the wafer holder 109 increases (as the absolute value of the negative voltage becomes larger), and the height of mirror reflection decreases as the negative voltage value of the wafer holder 109 decreases (as the absolute value of the negative voltage becomes smaller).

When the voltage of the wafer holder 109 is changed in the positive direction, the reflection height decreases to eventually cause the electron beam to start partly hitting the wafer surface. In this state, the electron beam is no longer reflected as mirror electrons. Hence, the first measurement value starts decreasing after the voltage of the wafer holder 109 increases in the positive direction beyond where the electron beam starts partly hitting the wafer surface (see solid line in FIG. 3). With regard to the second measurement value, as the reflection height decreases, fine distortion of the equipotential surface starts being reflected on the mirror electron image and high spatial frequency components start appearing and increasing. The second measurement value represented in FIG. 3 is calculated by using all integrated values of the spatial frequency distribution. However, when the irradiating electron beam starts hitting the wafer, the image formed is no longer a mirror reflection image. The image is formed by the electrons having interacted with the wafer surface. The conditions of image formation thus change and the image formed starts being blurred. Reflecting this state, the second measurement value starts decreasing.

When the voltage of the wafer holder 109 is changed in the negative direction, the reflection height increases and the mirror electron image deteriorates in resolution. Namely, high spatial frequency components decrease and the second measurement value decreases. No matter how much the reflection height increases, the irradiating electron beam is entirely reflected, so that the first measurement value stays constant.

The reflection height is automatically controlled making use of the tendencies shown in FIG. 3 of the first measurement value and the second measurement value. Before starting inspection operation, the user determines the ranges in which the first measurement value and the second measurement value are to be kept. For this, when setting inspection conditions beforehand, the user proceeds as follows. For this preparatory work, a wafer to be inspected may be used or, alternatively, a standard specimen may be prepared and used. While the negative voltage applied to the wafer holder 109 is changed in the positive direction, for example, in steps of 0.1 V starting in a state with a high reflection surface, plural mirror electron images are captured. Based on an optimum. mirror electron image for use as an inspection image out of the captured mirror electron images, a first measurement value (M1A) and a second measurement value (M2A) are calculated. Out of the mirror electron images corresponding to the wafer holder voltage on the positive side of the wafer holder voltage corresponding to the optimum mirror electron image, a tolerable limit mirror electron image is determined, then a first measurement value (M1B) of the tolerable limit mirror electron image is calculated. A permissible decrease ratio ($\alpha$=M1B/M1A) for the first measurement value of the optimum image is calculated and stored. Out of the mirror electron images corresponding to the wafer holder voltage on the negative side of the wafer holder voltage corresponding to the optimum mirror electron image, a tolerable limit mirror electron image is determined and a second measurement value (M2B) of the tolerable limit mirror electron image is calculated. A permissible decrease ratio ($\beta$=M2B/M2A) for the second measurement value of the optimum image is calculated and stored. Relationships among M1A, M2A, M1B, and M2B are also shown in FIG. 3.

During inspection operation, the reflection height is automatically controlled following a flowchart shown in FIG. 4. According to the flowchart, a fast Fourier transform (FFT) is performed to generate spatial frequency distribution from mirror electron images.

First, the reflection surface determination unit 118 collects an inspection image outputted from the image detection unit 113 (step S1), then generates an FFT-transformed image and calculates a first measurement value (M1) and a second measurement value (M2) (step 32). Next, the ratio of the first measurement value (M1) of the inspection image to the first measurement value (M1A) of the optimum image is calculated, and whether the ratio is smaller than. the permissible decrease ratio ($\alpha$) is determined (step S3). When, relative to the optimum image, the first measurement value (M1) of the inspection image is determined to have decreased exceeding the permissible decrease ratio $\alpha$, the reflection height is determined too low (the reflection surface is too close to the wafer surface) and the voltage (Vs) of the wafer holder 109 is changed by $\Delta$Vs in the negative direction (the absolute value is increased) (step 24). The voltage of the wafer holder 109 is also referred to as the "stage voltage." After changing the voltage of the wafer holder 109, the reflection surface determination unit 118 collects the next inspection image from the image detection unit 113 (step 25).

When the decrease of the first measurement value is within the permissible decrease ratio ($\alpha$), the ratio of the second measurement value (M2) of the inspection image to the second measurement value (M2A) of the optimum image is calculated, and whether the ratio is smaller than the permissible decrease ratio ($\beta$) is determined (step 26). When, relative to the optimum image, the second measurement value (M2) of the inspection image is determined to have decreased exceeding the permissible decrease ratio $\beta$, the reflection height is determined too high (the reflection surface is too far from the wafer surface) and the voltage (Vs) of the wafer holder 109 is changed by $\Delta$Vs in the positive direction (the absolute value is decreased) (step S7), and the next inspection image is collected (step S5). The voltage of the wafer holder 109 is changed by the inspection equipment control unit 115 that controls the high-voltage power supply 110 based on the results of determination made by the reflection surface determination unit 118. In connection with steps S4 and 57 in the flowchart shown in FIG. 4, the unit value of voltage change ($\Delta$Vs) for the voltage of the wafer holder 109 is determined beforehand by the user. In the process of determining each permissible voltage decrease ratio applied during the processing performed as shown in FIG. 4, each permissible voltage decrease ratio may be determined by multiplying the difference between the voltage corresponding to an optimum image and the voltage corresponding to a limit tolerable image by a certain factor, for example, 50%. The factor to be applied may be appropriately changed based on the results of inspection. As to the next image to be collected after adjusting the voltage of the wafer holder 109, the user is required to make prior selection between an image to be captured again at the same area of the wafer under inspection and a mirror electron image to be captured at a next area of the wafer under inspection.

When the first or second measurement value or the inspection image decreases largely exceeding the corresponding permissible decrease ratio, for example, exceeding by two times or more, the inspection operation is discontinued and a warning is issued to the user. The threshold permissible decrease ratios for issuing a warning to the user regarding the first measurement value and the second measurement value may be appropriately changed depending on the results of inspection.

In the above-described processing, an optimum mirror electron image needed in determining the permissible decrease ratios for the first and second measurement values is determined before inspection is started. In cases where the area to be inspected of the wafer surface is widely moved, an optimum mirror electron image may be redetermined through the same process as used before the inspection is started.

According to the first embodiment, the voltage applied to the wafer bolder 109 is controlled in the system described above, so that the height at which the irradiating electron beam is reflected above the wafer under inspection can be kept appropriate.

First Modification

Figure 5:
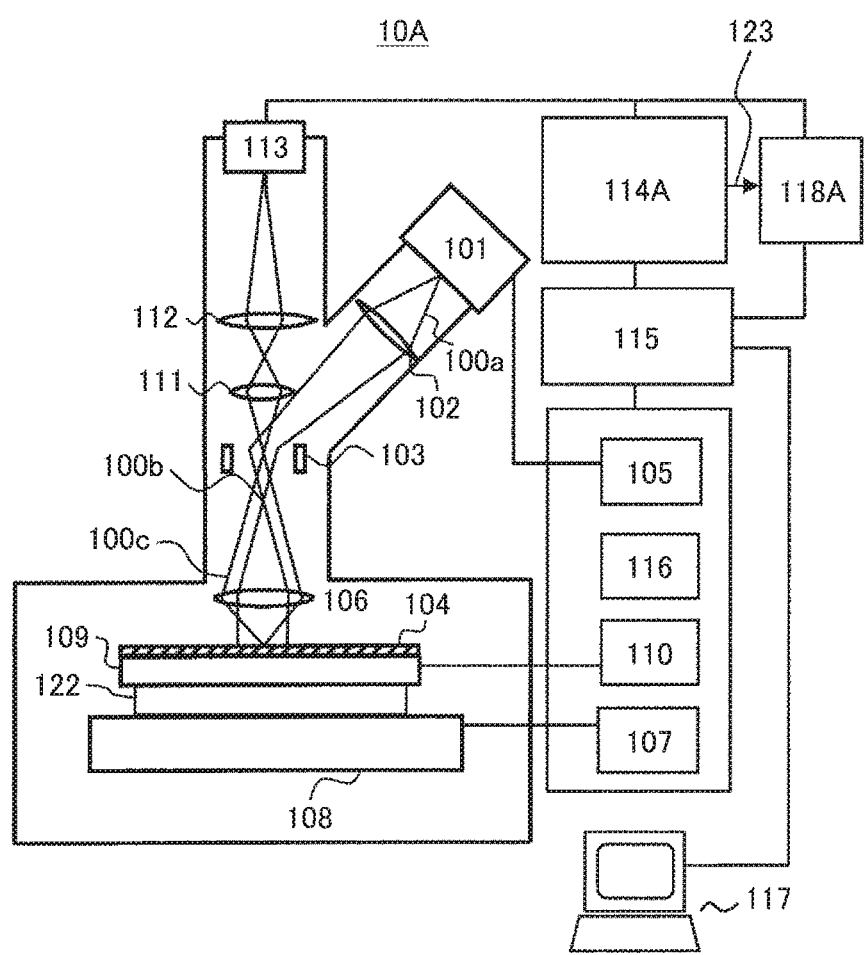
FIG. 5 is a diagram for explaining inspection equipment according to a first modification.

Inspection equipment according to a first modification of the first embodiment will be described with reference to FIG. 5. FIG. 5 shows a configuration of the inspection equipment of the first modification.

There are cases where an SiC wafer under inspection after being processed for epitaxial growth shows flaws left after being ground. When the reflection height is monitored for such a wafer, the flaws appear in the mirrored electron image of the wafer. When such flaws appear in a mirror electron image, high-frequency components are generated by contrasts generated by the flaws. Generation of such high-frequency components affects calculation of the second measurement value. This prevents the reflection height form being correctly adjusted.

According to the inspection equipment 10A of the first modification, the reflection height of an irradiating electron beam can be correctly adjusted even in cases as described above. As shown in FIG. 5, the inspection equipment 10A is configured such that a defect indication signal 123 indicating whether a defect is present received from a defect determination unit 114A is sent to a reflection surface determination unit 116A. The reflection surface determination unit 118A is set such that, when a signal indicating presence of a serious defect like a wafer surface flaw is outputted from the defect determination unit 114A, the reflection surface determination unit 118A does not send any voltage change signal for the high-voltage power supply 110 to the inspection equipment control unit 115. In this case, therefore, the reflection height is not adjusted. Except for the defect determination unit 114A and the reflection surface determination unit 118A, the inspection equipment 10A is configured identically to the inspection equipment 10.

In addition to or instead of the arrangement for signal output from the defect determination unit 114A, an arrangement may be made such that, based on defect location information obtained by performing inspection beforehand using optical equipment, wafer surface locations known to have serious defects are memorized and such that the reflection height is not adjusted when images of such known defective locations are captured.

In this way, when a serious defect appears in an inspection image, the reflection height is prevented from being erroneously determined.

Second Modification

Inspection equipment according to a second modification of the first embodiment will be described.

According to the first embodiment and the first modification described in the foregoing, the reflection height is monitored by the reflection surface determination unit 118 or 118A for every inspection image outputted from the image detection unit 113. When variation of the reflection height is caused by fluctuation of the output voltage of the high-voltage power supply, the reflection height variation is slow lasting over a long period of time. In such a case, it is not necessary to determine the reflection height for every inspection image, so that the reflection height is monitored at timing set by the user. The reflection surface determination unit of the second modification performs the processing described by the flowchart shown in FIG. 4 at time intervals set by the user or for every user-set number of inspection images. Except for the reflection surface determination unit, the inspection equipment of the second modification is configured identically to the inspection equipment 10 or 10A.

According to the second modification, inspection can be performed with a reduced load on the reflection surface determination unit while maintaining an appropriate reflection height.

Third Modification

Figure 6:
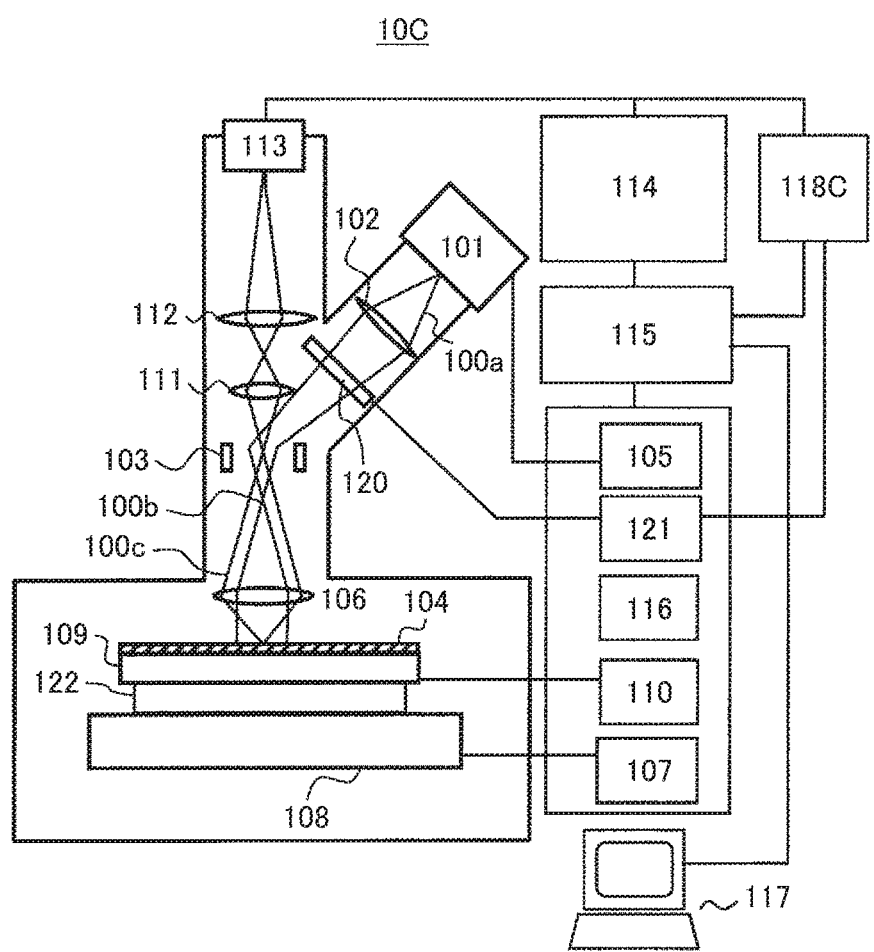
FIG. 6 is a diagram for explaining inspection equipment according to a third modification.

Inspection equipment according to a third modification of the first embodiment will be described with reference to FIG. 6. FIG. 6 shows a configuration of the inspection equipment of the third modification.

Inspection equipment 10C of the third modification includes, as shown in FIG. 6, a beam monitor 120 installed in its irradiation optical system. The beam monitor 120 is configured, for example, to use a pinhole for limiting the field of view and measure the amount of electron current shielded by the pinhole. The current amount of the electrons to forth a mirror image is detected by the beam monitor 120 and is evaluated based on the current amount measured by a measuring unit 121. The first measurement value of a mirror electron image to be used by a reflection surface determination unit 118D included in the inspection equipment 10C is normalized by an output (current value) of the measuring unit 121. Except for the beam monitor 120, measuring unit 121 and reflection surface determination unit 118C, the inspection equipment 10C is configured identically to the inspection equipment of the first embodiment, first modification, or second modification.

According to the third modification, the reflection height can be correctly determined and automatically controlled, even in cases where the current value of irradiating electrons varies. Such cases include, for example, cases where a cold-cathode electron gun is used and the current amount of the irradiating electron beam from the electron quo decreases.

Fourth Modification

Figure 7:
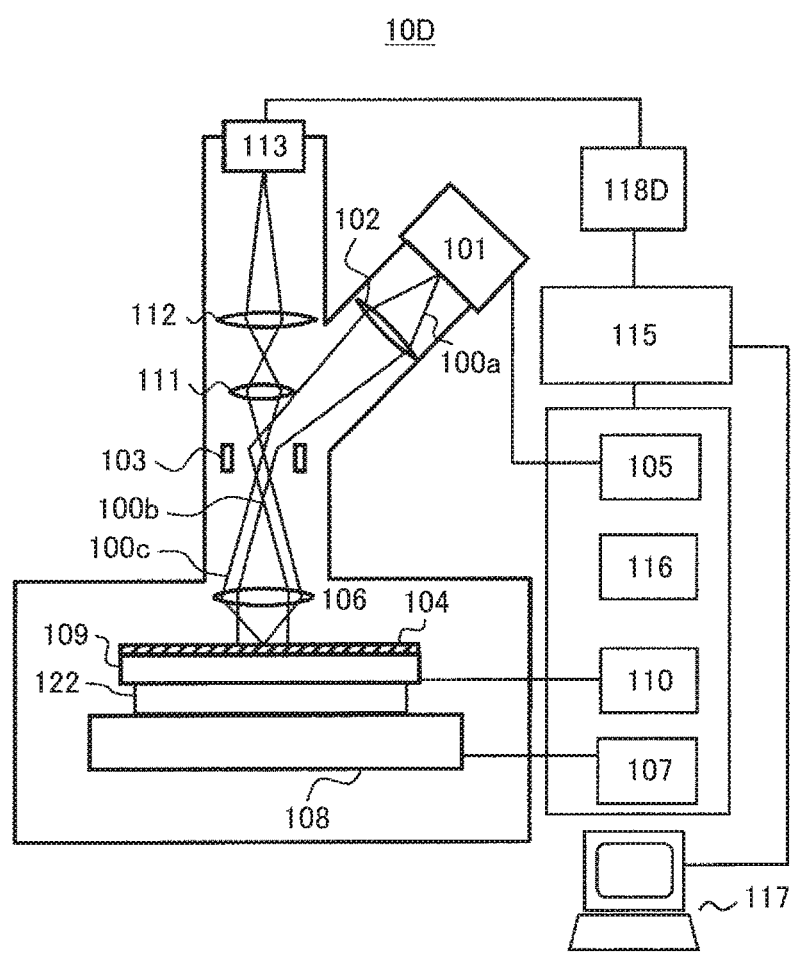
FIG. 7 is a diagram for explaining inspection equipment according to a fourth modification.

Inspection equipment according to a fourth modification of the first embodiment will be described with reference to FIG. 7. FIG. 7 shows a configuration of the inspection equipment of the fourth modification.

Inspection equipment 105 of the fourth modification is simplified defect inspection equipment using an automatic system for automatically adjusting the reflection height. In the inspection equipment of the first embodiment or first to third modifications, each inspection image is processed in real time by a defect determination unit to determine whether any defect exists and, if any exists, the type of the defect. Thus, the defect determination unit is required to perform complicated image processing at high speed and it makes the system expensive. The inspection equipment 10D includes no defect determination unit.

In the inspection equipment 10D, whether a defect exists or not is determined by a reflection surface determination unit 118D. To automatically control the reflection height, as described in the foregoing, a reflection surface determination unit 118D generates a spatial frequency intensity distribution image based on a mirror electron image. When a second measurement value representing an integrated value at a certain area of the spatial frequency in distribution image or representing a total of all integrated values decreases, the decrease is detected as indicating that the reflection surface rose to be more away from the wafer surface.

When a defect appears in an inspection image, it generates a contrast causing a new spatial frequency component to be generated. As a result, the second measurement value increases. In the fourth modification therefore, the reflection surface determination unit 118D is designed to output a defect detection signal to the inspection equipment control unit 115 upon detection of an increase of the second measurement value. Except for the reflection surface determination unit 118D, the inspection equipment 10D is configured identically to the inspection equipment of the first embodiment.

According to the configuration of the fourth modification described above, defect types cannot be determined, but a database storing data about inspection images showing defects can be generated. Based on such information, mirror electron images showing defects are processed offline to determine defect types. Or, images of defect locations are transferred to an external observation device, for example, a scanning electron microscope, for reobservation. When inspecting a wafer having only a small number of defects, most of its inspection images show no defects, so that it is not necessary to process every one of its inspection images. This makes it possible to manage wafers using the configuration of the inspection equipment 10D.

According to the fourth modification, low-priced defect inspection equipment to detect defect locations only without requiring any powerful image processing system can be provided.

Except for the reflection surface determination unit 118D, the configuration of the inspection equipment 10D can be modified to be identical to the configuration of the second or third modification.

Second Embodiment

Figure 8:
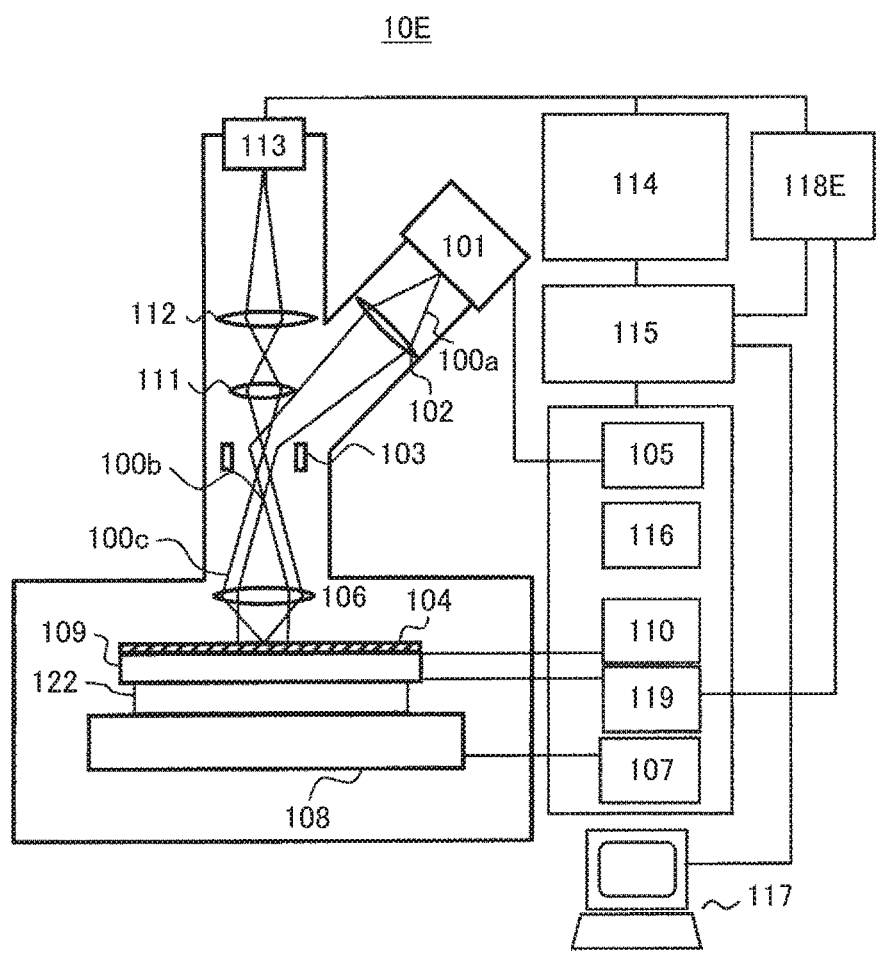
FIG. 8 is a diagram for explaining inspection equipment according to a second embodiment.
Figure 9:
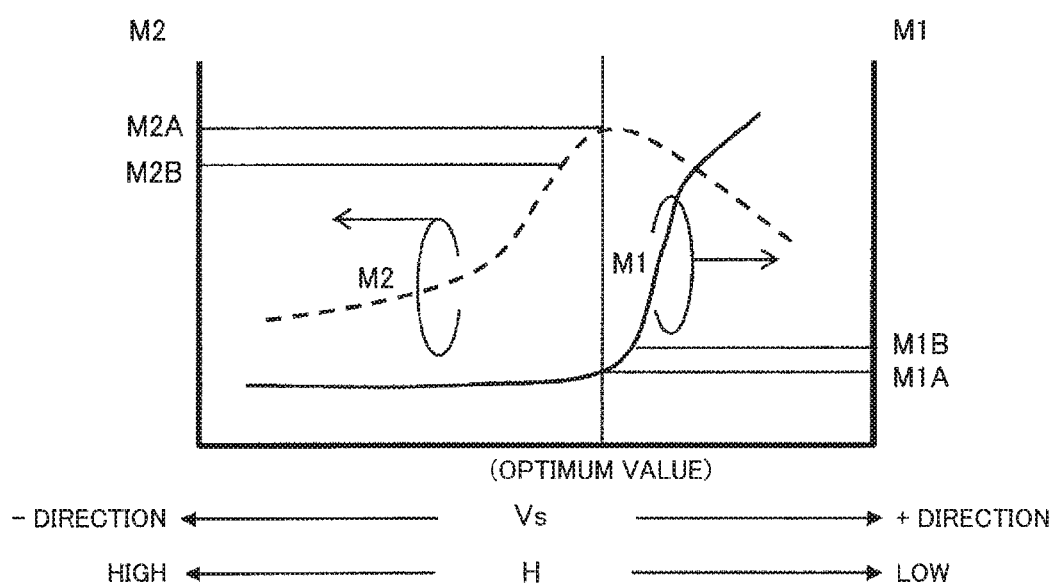
FIG. 9 is a diagram for explaining the inspection equipment according to the second embodiment.

Inspection equipment of a second embodiment according to the embodiment form will be described with reference to FIGS. 8 to 9. FIG. 8 shows a configuration of the inspection equipment of the second embodiment. FIG. 9 shows how a first measurement value and a second measurement value vary.

Inspection equipment 10E of the second embodiment includes, as shown in FIG. 8, an absorbed current meter 119 which constantly measures the absorbed current from a wafer under inspection and outputs the measurement to a reflection surface determination unit 118E. The reflection surface determination unit 118E uses the measurement value outputted from the absorbed current meter 119 as a value corresponding to a first measurement value used in the first embodiment. A mirror electron image normalized a first measurement value is partially or wholly frequency-transformed with respect to position coordinates. Except for the reflection surface determination unit 118E, the inspection equipment 10E is configured identically to the inspection equipment 10.

In this case, the first measurement value behaves as shown in FIG. 9 relative to the voltage of the wafer holder 109. When the voltage of the wafer holder 109 is high in the negative direction, the electron beam is reflected at a high reflection surface above the wafer surface, so that the value of the absorbed current from the wafer remains extremely small. When the voltage of the wafer holder 109 increases to be higher in the positive direction causing the irradiating electron beam to start partly hitting the wafer surface, the absorbed current starts increasing causing the first measurement value to increase.

For reflection height control, a permissible increase ratio ($\alpha$=M1B/M1A) is calculated beforehand, where M1A is an absorbed current value corresponding to an optimum mirror electron image for inspection and M1B is an absorbed current value corresponding to a limit tolerable mirror electron image resulting from an increase in the positive direction of the voltage of the wafer holder 109. When an inspection image collected increases the first measurement value exceeding the permissible increase ratio ($\alpha$) for the first measurement value, the reflection height is determined too close to the wafer surface and the voltage of the wafer holder 109 is changed by $\Delta Vs$ in the negative direction. The second measurement value is controlled as in the first embodiment.

According to the second embodiment, the reflection height can be constantly monitored to keep it appropriate without using the origin value after a spatial frequency transform of a mirror electron image.

The configuration of the inspection equipment 10E can be changed to the configuration of any of the first to fourth modifications.

Three Embodiment

Inspection equipment of a third embodiment according to the embodiment form will be described.

According to the inspection equipment of the third embodiment, the sum of mirror electron image intensities is used as a first measurement value from the first embodiment instead of an origin value after a spatial frequency transform. To transform an inspection image into a spatial frequency distribution image by an FFT, the number of pixels in each of the length and width directions of the original mirror electron image is required to be a power of 2. When this condition is not met by the original image captured by the image detection unit 113, it is necessary to perform an FFT on a portion meeting the above condition of the original image. In this case, the origin value after an FFT represents the brightness of the portion processed by an FFT of the original image. Namely, the origin value after an FFT does not represent the brightness of the whole of the original image. In cases where defects are expected to appear all over an inspection image, adopting the brightness of the whole of the inspection image as a first measurement value prevents the first measurement value from decreasing even in the above case. Namely, erroneous automatic control of the reflection height can be avoided. Except for the reflection surface determination unit, the inspection equipment of the third embodiment is configured similarly to the inspection equipment 10.

According to the third embodiment, regardless of the number of pixels of an inspection image, the reflection height can be automatically controlled without involving errors caused depending on the manner in which defects are imaged.

The configuration of the inspection equipment of the third embodiment can be changed to the configuration of any of the first to fourth modifications.

The invention made by the present inventors has been described in concrete terms based on an embodiment form, embodiments and modifications. However, the invention is not limited to the above embodiment form, embodiments and modifications and can be modified in various ways.

What is claimed is:
1. Inspection equipment, comprising:
an irradiation optical system to irradiate an area including a field of view on a wafer with an electron beam emitted from an electron source;
a voltage application unit to apply a controlled negative voltage to the wafer or a wafer holder holding the wafer;
a mirror-electron imaging optical system to capture a mirror electron image by, with the voltage applied to the wafer or the wafer holder, having an image formed by electrons reflected from the wafer;
a calculation unit that frequency-transforms the mirror electron image with respect to position coordinates and calculates a value of a frequency plane origin or a value at a vicinity of the frequency plane origin as a first measurement value and that also calculates a second measurement value by totalizing values of image intensities in a certain area the image intensities having been obtained through normalization by the origin value or origin-vicinity value and the frequency transform;

a control unit that, based on the first measurement value and the second measurement value, outputs to the voltage application unit a signal to control the voltage applied by the voltage application unit; and a defect detection unit that detects a defect of the wafer using the mirror electron image obtained at the voltage controlled by the control unit.

2. The inspection equipment according to claim 1, wherein, when the second measurement value decreases exceeding a predetermined range relative to a predetermined second setting value whereas the first measurement value is in a predetermined range relative to a predetermined first setting value, the control unit outputs a signal for decreasing an absolute value of the voltage to the voltage application unit.

3. The inspection equipment according to claim 2, wherein, when the first measurement value decreases exceeding a predetermined range relative to a predetermined first setting value, the control unit outputs a signal for increasing an absolute value of the voltage to the voltage application unit.

4. The inspection equipment according to claim 3 wherein, in frequency-transforming the mirror electron image, the calculation unit, taking into account also a frequency range not attributable to any defect of the wafer, totalizes values of intensities normalized by the origin value or origin-vicinity value.

5. The inspection equipment ac cording to claim 1, wherein the frequency transform is performed using a fast Fourier transform algorithm.

6. Inspection equipment, comprising:

an irradiation optical system to irradiate an area including a field of view on a wafer with an electron beam emitted from an electron source;

a voltage application unit to apply a controlled voltage to the wafer or a wafer holder holding the wafer;

a mirror-electron imaging optical system to capture a mirror electron image by, with the voltage applied to the wafer or the wafer holder, having an image formed by electrons reflected from the wafer;

a calculation unit that makes an absorbed current from the water or a sum of intensity values of a whole of the mirror electron image a first measurement value and that frequency-transforms, with respect to position coordinates, a whole or part of the mirror electron image normalized by the first measurement value and calculates a second measurement value by totalizing value of transformed image intensities in a certain area;

a control unit that, based on the first measurement value and the second measurement value, outputs to the voltage application unit a signal to control the voltage applied by the voltage application unit; and a detection unit that detects a defect of the wafer using the mirror electron image obtained at the voltage controlled by the control unit.

7. The inspection equipment according to claim 6, wherein, when the second measurement value decreases exceeding a predetermined range relative to a predetermined second setting value whereas the first measurement value is in a predetermined range relative to a predetermined first setting value, the control unit outputs a signal for decreasing an absolute value of the voltage to the voltage application unit.

8. The inspection equipment according to claim 7, wherein, when the first measurement value decreases exceeding a predetermined range relative to a predetermined first setting value, the control unit outputs a signal for increasing an absolute value of the voltage to the voltage application unit.

9. The inspection equipment according to claim 8, wherein, in frequency-transforming the mirror electron image, the calculation unit, taking into account also a frequency range not attributable to any defect of the wafer, totalizes values of intensities normalized by the origin value or origin-vicinity value.

10. The inspection equipment according to claim 6, wherein the frequency transform is performed using a fast Fourier transform algorithm.

11. The inspection equipment according to claim 1, wherein, when the defect detection unit indicates presence of a defect during inspection operation or when a predetermined location is being imaged, the voltage applied by the voltage application unit is not changed.

12. The inspection equipment according to claim 1, further comprising an input unit through which a user inputs an optional number of wafers or an optional amount of time as a setting so as to have the applied voltage updated every time the optional number of wafers have been inspected or every time the optional amount of time has elapsed.

13. The inspection equipment according to claim 1, further comprising monitoring means to monitor a current value of an irradiating electron beam, wherein the first measurement value is normalized by the monitored current value of the electron beam.

14. The inspection equipment according to claim 1, wherein, when the second measurement value increases exceeding a predetermined range relative to a predetermined second setting value, the control unit outputs a wafer defect indication signal to the detection unit or to a display unit to display an indication of whether the wafer has a defect.

15. The inspection equipment according to claim 14, wherein, for a mirror electron image of a coordinate location to which the wafer defect indication signal corresponds, a defect type is determined.

* * * * *